Figure 1:
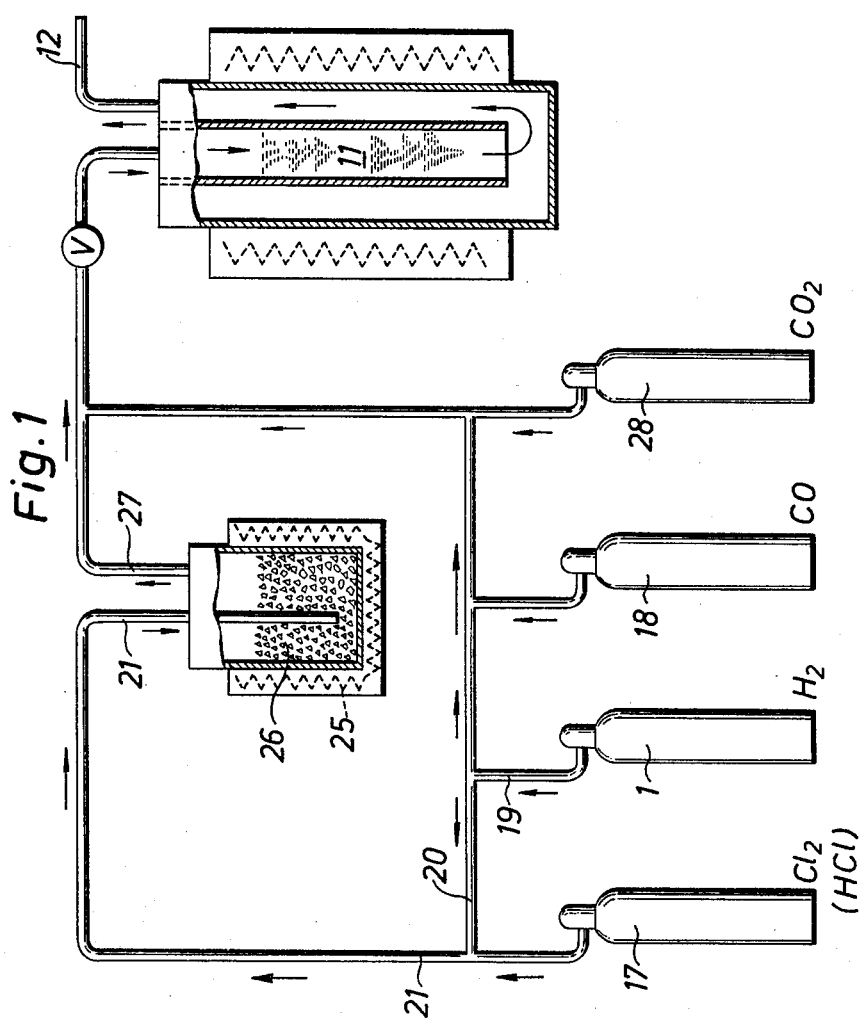

United States Patent [19]

Lindstrom et al.

[11] 3,977,061

[45] Aug. 31, 1976

[54] CUTTING INSERT AND METHOD OF MAKING THE SAME

[75] Inventors: Jan Nils Lindstrom, Norsborg; Fall Johan Olof William Ohlsson, Enskede, both of Sweden

[73] Assignee: Sandvik Aktiebolag, Sandviken, Sweden

[22] Filed: Sept. 10, 1974

[21] Appl. No.: 504,819

[30] Foreign Application Priority Data

Sept. 17, 1973 Sweden............................ 7312610

[52] U.S. Cl. ........................... 29/95 R; 30/346.54; 428/212; 428/213; 428/334; 428/336; 428/410; 428/428; 428/539
[51] Int. Cl.².................. B32B 17/06; B23P 15/28; B32B 9/04
[58] Field of Search ............ 161/162, 166; 428/325, 428/336, 334, 409, 212, 213, 539, 428, 410, 335; 117/106 C, 106 R, 69, 70 A, 70 R; 30/346.53, 346.54; 29/95 R

[56] References Cited
UNITED STATES PATENTS

| | | | |
|---|---|---|---|
| 2,943,008 | 6/1960 | Saunders............................ | 161/162 |
| 3,014,815 | 12/1961 | Lely.................. | 117/106 R |
| 3,208,873 | 9/1965 | Ames.............................. | 117/106 R |
| 3,615,275 | 10/1971 | Turk .................. | 117/106 R |
| 3,642,522 | 2/1972 | Gass.................. | 117/106 C |
| 3,692,565 | 9/1972 | Lersmacher ..................... | 117/106 C |
| 3,836,392 | 9/1974 | Lux .............................. | 117/106 R |
| 3,837,896 | 9/1974 | Lindstrom...................... | 117/106 A |
| 3,852,098 | 12/1974 | Bloss.............................. | 117/106 R |

Primary Examiner—Harold Ansher
Assistant Examiner—Ellis P. Robinson
Attorney, Agent, or Firm—Pierce, Scheffler & Parker

[57] ABSTRACT

The wear resistance and toughness of a cutting insert comprising a ceramic oxide is improved by applying to it a thin surface layer of ceramic oxide, deposited from a gaseous phase, in which surface layer the grains have a size smaller than 1 micron and preferably smaller than 0.5 micron.

In effecting the deposition, at least one of the components of the gaseous phase is present therein in the highest concentration possible without formation of powder.

2 Claims, 2 Drawing Figures

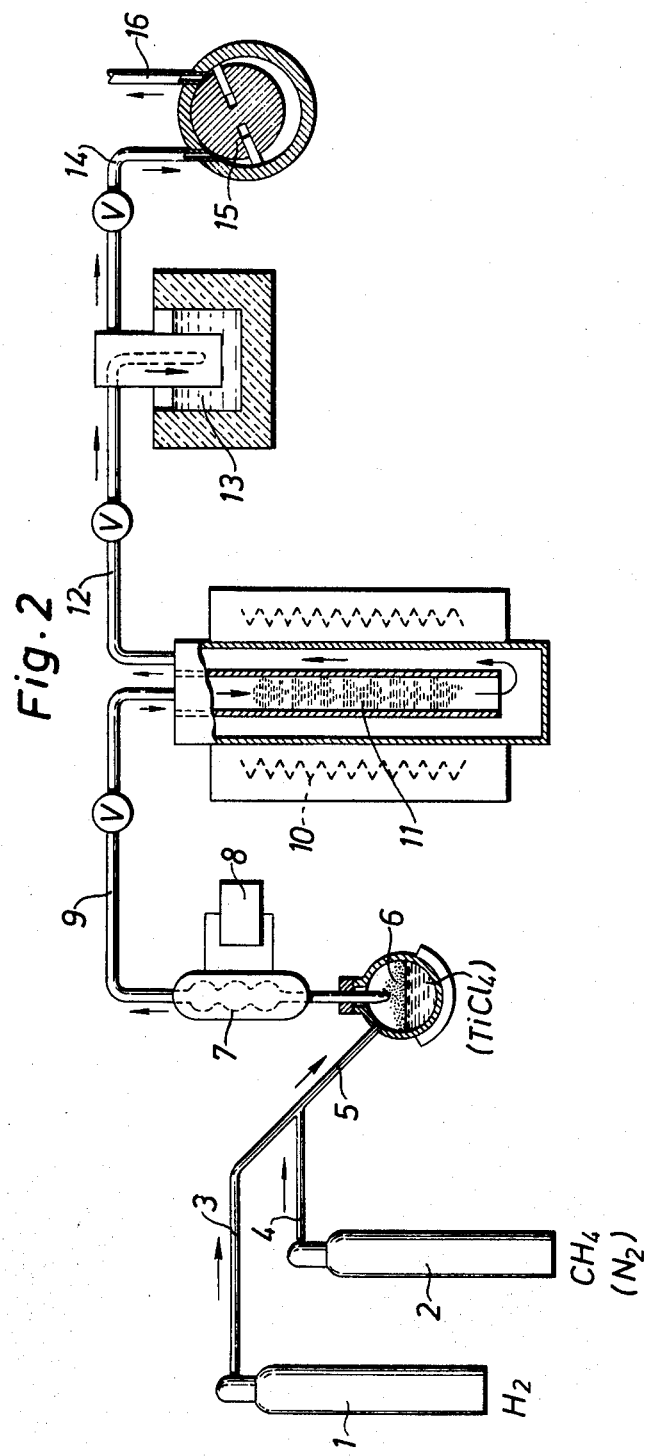

CUTTING INSERT AND METHOD OF MAKING THE SAME

The present invention relates to a cutting insert consisting essentially of ceramic oxides and, in particular, to a cutting insert having thin, extremely fine-grained surface layer. The invention also deals with a method of manufacturing said insert.

Many different methods of making ceramic cutting inserts have previously become known. For example, solids bodies of ceramic oxides — usually consisting of $Al_2O_3$ with optional addition of other oxides as for example TiO or MgO — have been prepared by a sintering technique. Also, cutting inserts of composite or semi-ceramic type are well known, the ceramic material (of oxide) being mixed with one or more hard carbides, nitrides or the like or with binder metal. The essential reason for such additions of admixtures has been to improve the toughness or strength, and more precisely the toughness considered in the macro- as well as in the micro- scale. Thus, cutting inserts of sintered aluminum oxide do not have particularly good resistance to wear of the clearance face or to cratering, if the potential capacity is taken into consideration.

It has been found, however, that the wear resistance is increased if the grain size of the aluminum oxide is made as small as possible. Furthermore, to obtain a good cratering resistance it is necessary that the grains are strongly bonded to each other or to other present materials. It is difficult, however, to meet both of said requirements, because a good binding or bond demands high sintering temperature, which latter customarily has the disadvantage that it increases the grain size.

An important reason for the previously encountered unsatisfactory toughness and wear resistance is thus the fact that it has not been possible to reduce the grain size of ceramic cutting inserts sufficiently, which means a lowest limit of about 2 $\mu$m (microns) mean grain size. As indicated before, it is known that a cutting edge consisting of large grains is broken down more readily than a cutting edge consisting of smaller grains. Ceramic inserts are normally worn out by the breaking of their cutting edges.

A radical solution of the problem of reducing the grain size to desired level has now been found in an unexpected and surprising way. The new method is based upon the technique of applying thin ceramic surface layers having extremely small grain size upon a ceramic substrate or cutting insert. In applying the layer by means of deposition from a gaseous phase (i.e., so-called "CVD"-methods ["Chemical Vapor Deposition"]), it is possible to reduce the grain size below 1 $\mu$m. Furthermore, said deposition includes or builds up the cutting edge area where the fine grained material is needed. The grain size is preferably reduced to <0.5 $\mu$m. By means of the invention, even a substrate having very good macroscale toughness (being for example of mixed ceramic type) can be used without any reduction of wear resistance and strength.

It has been found that thin ceramic layers, being composed of $Al_2O_3$, for example, having a thickness of 0.5–100 $\mu$m (and preferably 1–8 $\mu$m) are sufficient to give the desired effect regarding both the cutting edge strength or toughness and the wear resistance. The substrate advantageously may be a ceramic, essentially $Al_2O_3$, sometimes having improved "macro toughness" by alloying with binder metal.

It previously had been proposed to make solid bodies of ceramic material by means of CVD-technique. This method is very expensive, however. It is also particularly difficult, if not impossible, to make sharp cutting edges by said technique. Furthermore, a high deposition rate has to be used for economical reasons, which means that the grain size of the material will be relatively coarse. It is possible, however, also to coat such bodies having pure CVD-character beneficially by means of the invention, for example by changing over to conditions giving a fine-grained structure at the end of the CVD-coating. In most cases, however, a forming or shaping operation would be necessary before the fine grained layer could be applied.

There also previously had been known other methods of coating with oxides, in which have been mentioned incidentally that ceramic materials may be coated with stable oxides including $Al_2O_3$. Known cases relate to coating by means of flame spraying, however, in which the grain size cannot be reduced as by a CVD-method. Furthermore, the layers could not be made so thin or uniform by said methods that a following working or finishing could be avoided. Thus, the known methods do not at all deal with the concept of using the same material in substrate and layer, at which for example only the grain size is different.

The coated inserts according to the invention can thus be manufactured according to methods known per se. The substrate is normally manufactured by pressing and sintering technique and thus the surface layer is applied by means of deposition from a gaseous phase. To obtain a particularly fine grain size it is urgent to have the highest possible over-saturation in the gas, without driving the over-saturation so far that a formation of powder will occur. (Over-saturation is present when the beginning concentrations of reactants and products — ordered as in an equilibrium equation — are greater than the equilibrium concentrations ordered in an analogous way.)

Another method of preparing a particularly fine-grained layer of ceramics is to deposit — as an intermediate step — a thin, extremely fine-grained layer of hard carbide and/or nitride,— for example, TiC. This intermediate layer reduces the grain size of the ceramic layer applied upon said intermediate layer, in an epitaxy way (said method thus means that the crystal structure of the ceramic layer will be adapted to the structure of the substrate, in this case the intermediate layer). Among hard principles which have been found particularly suitable to form an intermediate layer are carbides and/or nitrides of Ti, Zr, Hf, V, Nb, Ta, Cr, Mo, W, Si and/or B.

Besides $Al_2O_3$, the ceramic layer can also consist of an oxide of Zr, Si, Ca, Mg, Ti and/or Hf. Such layers can also be applied in combination or upon each other, depending upon different demands or possibilities.

The method used in preparing ceramic cutting inserts according to the invention will now be described by illustrations in the following examples 1–4, and with reference to the attached drawings which show:

FIG. 1, principle sketch of an apparatus for depositing surface layers;

FIG. 2, principle sketch of an alternative detail in the apparatus according to FIG. 1.

The apparatus sketched in FIG. 1 illustrates the use of a chlorinating reactor 25 for chlorination of Al, for example, in the form of grains 26. For this purpose hydrogen from a gas source 1 is mixed by conduits 19, 20 with chlorine alternatively hydrochloric acid from a source 17 and the mixture is led to the chlorinating reactor through a conduit 21. The gas mixture from the chlorinating reactor 25 is then mixed with hydrogen and carbon monoxide and carbon dioxide from the gas source 18 respectively 28. The resulting mixture is then led to the coating reactor 11 by the valve-equipped conduit 27.

The apparatus shown in FIG. 2 has gas sources, for example gas tubes 1, 2 for supply of hydrogen respectively methane and/or nitrogen. The conduits 3 and 4 from the respective sources combined into a conduit 5, by which latter the gas mixture is led to a vessel 6 in which a metal halide (for example $TiCl_4$) is heated to vaporization, the resulting composite gas being led to the reactor 11 by a common conduit 9. The gas mixture passes a heat exchanger 7 controlled by a thermostat 8 for setting the content of $TiCl_4$ in the gas. In the reactor 11, being heated by means of a furnace 11, the substrate is placed for coating. From the reactor vessel 11 the gas is sucked out, passing a valve-equipped conduit 12 and a cool trap 13. The evacuation of gas from the system is done in a conduit 14 by means of a vacuum pump 15 having an outlet 16. (In the drawings, purification means for gas have been omitted.)

In the following examples 1–4 there are given those conditions under which ceramic cutting inserts according to the invention have been prepared. In the examples 5–6 there are results which have been obtained in cutting tests.

EXAMPLE 1

A ceramic cutting insert, consisting of $Al_2O_3$ with an addition of MgO, was coated with a thin surface layer of $Al_2O_3$. The mean grain size of the substrate or the ceramic cutting insert was about 5 $\mu$m. The coating was performed by means of CVD-technique, in which a conversion took place essentially between aluminum chloride, carbon dioxide and hydrogen according to the reaction: $2AlCl_3 + 3CO_2 + 3H_2 \rightarrow Al_2O_3 + 3CO + 6HCl$. The following conditions were used:

| Length of the coating operation: | 7 minutes |
|---|---|
| Temperature of the substrate: | 1000°C. |
| Total pressure of the gaseous phase: | 50 torr (mm Hg) |

Supplied amounts of gas (the volumes reduced to the temperature of 20° C. and the pressure of 760 torr):

| hydrogen: | 200 cm³/min. |
|---|---|
| carbon containing gas: | 200 cm³/min. |
| aluminum chloride: | 10 mg/min. |

The formed surface layer consisted essentially of alpha-aluminum oxide having a grain size of about 1 $\mu$m and had a thickness of about 1 $\mu$m.

EXAMPLE 2

Coating with a surface layer of $Al_2O_3$ was performed in a reactor whose essential parts were made of a nickel alloy. In this reactor vessel 3000 sintered ceramic cutting inserts were heated to 1100° C. The inserts were made of $Al_2O_3$ with a certain addition of TiO. The grain size was 2 $\mu$m. The inserts were placed on strainer-like plates so that a good contact with the surrounding gas would be obtained. The gas being a mixture consisting of 86% $H_2$, 5% $CO_2$, 4% CO and 5% $Al_2O_3$, prepared in a way per se known was led to the reactor in a single conduit. The pressure in the reactor could be maintained at 15 torr (mm Hg) because the gas was sucked out of the reactor vessel by means of a vacuum pump protected from corrosive reaction products (for example HCl) by a cool trap with liquid nitrogen situated before the pump. In this way a linear gas flow rate of 3.5 m/sec. was obtained in the charge. Said treatment was continued for 3 hours. As a result extremely fine-grained and homogeneous surface layers were obtained. The grain-size was above 0.5 $\mu$m and the thickness of this surface layer was about 2 $\mu$m.

EXAMPLE 3

Coating with an intermediate layer of TiC was done according to a method analogous with the method described in Example 2. The substrate was 3000 sintered cutting inserts of mixed ceramic type consisting of $Al_2O_3$ with additions of WC + Co. The mean grain size was about 7 $\mu$m.

The deposition gas — consisting of a mixture consisting of 10% $TiCl_4$, 8% $CH_4$ and 82% $H_2$ — was prepared in known ways. The pressure in the reactor was maintained at 15 torr (mm Hg), and a linear gas flow rate of 1 m/sec. was maintained in the charge. Said treatment was continued for 30 minutes. As a result, there were obtained fine-grained, compact layers of TiC with a thickness of about 2 $\mu$m.

In a separate second step, the 3000 cutting inserts were treated in an equipment nearly identical with the apparatus earlier described. The gas supplying system was different, however, in that a gas having the composition 82% $H_2$, 5% $CO_2$, 8% CO and 5% $AlCl_3$ could be dosed. The substrate temperature was 1100° C. and the pressure 15 torr. A linear gas flow rate of 3.5 m/sec. was used. After a coating time of 3 hours, 2 $\mu$m thick layers of $Al_2O_3$ had been formed upon the TiC-coated cutting inserts. The bond of the $Al_2O_3$ layer to the TiC layer was good and the grain size of the latter layer was <0.5 $\mu$m.

EXAMPLE 4

Coating of ceramic cutting inserts was effected with silicon dioxide in an apparatus of the same kind as in earlier examples. The substrate was ceramic inserts consisting of $Al_2O_3$ with an addition of MgO. The mean grain size was about 5 $\mu$m.

In the apparatus where the treatment was carried out, the gas supply system had been modified so that a gas with the composition 70% $H_2$, 5% $CO_2$, 20% CO and 5% $SiCl_4$ could be dosed. The substrate temperature was 1100° C. and the pressure was 15 torr. A linear gas flow rate of 3.5 m/sec. was maintained. After a treatment of 3 hours, 2 $\mu$m thick layers of $SiO_2$ had been formed. The adherence of the $SiO_2$ layer to the substrate was excellent and its grain size was <0.5 $\mu$m.

EXAMPLE 5

Test cutting by means of inserts made according to Example 2.
Conditions:
Turning of a brake drum (roughing of a flange)
Material: Steel with a hardness of HB 180
Tool: Insert holder "T-Max"

Insert type "SNGN 120812"
Primary land=0.2 mm × 20°

| Cutting data: | |
|---|---|
| Cutting speed: | 328–288 m/min |
| Feed: | 0.49 mm/rev |
| Cutting depth: | 3 mm |
| Criterion of wear: | insert failure |

Uncoated ceramics: 82 min
Coated ceramic according to Example 2: 122 min
Increase of production: about 50%
This test showed that a considerable increase in productivity can be obtained by means of the improved edge toughness.

EXAMPLE 6

Another cutting test by means of inserts prepared according to Example 2.
Conditions:
Turning of a brake drum (finishing)
Material: Alloyed steel with a hardness of HB 230
Tool: Insert holder "T-Max"
  Insert type "SNUN 120424"
  Primary land = 0.05 mm × 20°

| Cutting data: | |
|---|---|
| Cutting speed: | 500 m/min. |
| Feed: | 0.21 mm/rev. |
| Cutting depth: | 1 mm |

Criterion of wear: Inferior surface finish
Uncoated ceramics: 17 min
Coated ceramics according to Example 2: 42 min
In finishing, the inserts coated according to the invention obtained an essentially increased life.

We claim:
1. A cutting insert for chip-forming machining said insert consisting of a sintered substrate of of at least one wear-resisting ceramic oxide or of wear-resisting ceramic oxide mixed with at least one hard carbide or nitride and binder metal, on which substrate is a wear-resisting ceramic oxide surface layer consisting of an oxide from of the group consisting of Al, Zr, Si, Ca, Mg, Ti and Hf, the surface layer having been deposited from a gaseous phase and having a thickness of 0.5–100 $\mu$m, its mean grain size being smaller than 1 $\mu$m and essentially smaller than is the mean grain size of the sintered substrate.

2. A cutting insert according to claim 1, in which a thin and extremely fine-grained intermediate layer of a material is applied between the thin surface layer consisting of wear-resisting ceramic oxide and the essentially ceramic substrate, said intermediate layer consisting essentially of a member of the group consisting of carbides and nitrides of Ti. Zr, Hf, V, Nb, Ta, Cr, Mo, W, Si and B.

* * * * *